US011501782B2

(12) United States Patent
Sugiura et al.

(10) Patent No.: US 11,501,782 B2
(45) Date of Patent: Nov. 15, 2022

(54) ENCODER, DECODER, ENCODING METHOD, DECODING METHOD, PROGRAM, AND RECORDING MEDIUM

(71) Applicant: NIPPON TELEGRAPH AND TELEPHONE CORPORATION, Chiyoda-ku (JP)

(72) Inventors: Ryosuke Sugiura, Atsugi (JP); Yutaka Kamamoto, Atsugi (JP); Takehiro Moriya, Atsugi (JP)

(73) Assignee: NIPPON TELEGRAPH AND TELEPHONE CORPORATION, Chiyoda-ku (JP)

( * ) Notice: Subject to any disclaimer, the term of this patent is extended or adjusted under 35 U.S.C. 154(b) by 12 days.

(21) Appl. No.: 17/044,968

(22) PCT Filed: Mar. 4, 2019

(86) PCT No.: PCT/JP2019/008388
§ 371 (c)(1),
(2) Date: Oct. 2, 2020

(87) PCT Pub. No.: WO2019/198383
PCT Pub. Date: Oct. 17, 2019

(65) Prior Publication Data
US 2021/0166700 A1 Jun. 3, 2021

(30) Foreign Application Priority Data

Apr. 13, 2018 (JP) .............................. JP2018-077457

(51) Int. Cl.
*G10L 19/00* (2013.01)
(52) U.S. Cl.
CPC .................... *G10L 19/00* (2013.01)
(58) Field of Classification Search
CPC .............................. G10L 15/14; G10L 19/00
(Continued)

(56) References Cited

U.S. PATENT DOCUMENTS

| 2006/0092053 A1* | 5/2006 | Malvar | .................... H03M 7/00 341/51 |
| 2010/0027903 A1* | 2/2010 | Takamura | ............... H03M 7/40 382/248 |
| 2018/0137873 A1* | 5/2018 | Moriya | .................. G10L 19/002 |

FOREIGN PATENT DOCUMENTS

| JP | WO2014054556 A1 * | 1/2016 | ............. H03M 7/40 |
| JP | WO2014054556 A1 * | 8/2016 | ............. H03M 7/40 |

OTHER PUBLICATIONS

Decoding billions of integers per second through vectorization Daniel Lemire, Leonid Boytsov (Year: 2012).*

(Continued)

*Primary Examiner* — Bharatkumar S Shah
(74) *Attorney, Agent, or Firm* — Oblon, McClelland, Maier & Neustadt, L.L.P.

(57) ABSTRACT

The present invention aims to encode and decode a sequence of integer values by substantially assigning the number of bits of a decimal fraction value per sample. An integer converter 11 selects M selected integer values from L input integer values for a set of the L input integer values and obtains J-value selection information that specifies which of the L input integer values the M selected integer values are. Furthermore, the integer converter 11 obtains one converted integer value by reversibly converting the M selected integer value and an integer value corresponding to the J-value selection information. An integer encoder 12 encodes the converted integer value to obtain a code.

10 Claims, 4 Drawing Sheets

(58) Field of Classification Search
USPC .......................................................... 704/503
See application file for complete search history.

(56) References Cited

OTHER PUBLICATIONS

C. B. Lizarraga and E. S. Tellez, "Operators over Compressed Integer Encodings," 2010 XXIX International Conference of the Chilean Computer Science Society, 2010, pp. 290-297, doi: 10.1109/SCCC.2010.46. (Year: 2010).*

* cited by examiner

ENCODER, DECODER, ENCODING METHOD, DECODING METHOD, PROGRAM, AND RECORDING MEDIUM

TECHNICAL FIELD

The present invention relates to a technique for encoding and decoding a sample sequence composed of integer values such as a sample sequence of an audio or acoustic time-series digital signal.

BACKGROUND ART

As techniques for encoding a sample sequence for the purpose of compression, there is a technique that reversibly encodes finite-precision values (hereinafter referred to as integer values) obtained by quantizing sample values and reduces bit length used for describing the sample sequence. In this technique, assigning which length code to which integer value is directly related to compression performance. This fact is no exception even in engineering applications of sample sequence encoding/decoding such as image encoding for encoding/decoding a sample sequence of an image signal and acoustic encoding for encoding/decoding a sample sequence of an acoustic signal. In addition, reversible encoding can be applied to irreversible encoding by which bit length can be further reduced by combining it with quantization of the sample sequence.

Generally, in variable-length reversible encoding, there is a constraint on the configuration of codes assigned to integer values due to the constraint of decoding possibility. Specifically, it is a constraint in which if a short code is assigned to a given integer value, long codes must be assigned to other integer values in order to make them decodable. Therefore, in order to enhance compression performance, the configuration of codes (assignment of codes to respective integer values) needs to suit the distribution of values in a sequence of integer values. Specifically, by assigning a short code to an integer value with a high appearance probability and assigning a long code to an integer value with a low appearance probability, an expected value of compressed bit length of the sequence of integer values can be reduced.

As techniques for encoding a sample sequence, there is a technique described in Non-patent literature 1. The technique described in Non-patent literature 1 is a technique for obtaining a sequence made up of the numbers of bits assigned to respective samples included in a sample sequence which is a frequency spectrum sequence of an audio/acoustic signal and reversibly encoding the respective samples of the quantized sample sequence so that codes of the numbers of bits included in the sequence made up of the numbers of bits can be obtained. The technique described in Non-patent literature 1 assumes a statistical distribution in which the frequency spectrum sequence of the audio/acoustic signal includes more samples with small amplitude values, refers to an envelope or the like in the frequency spectrum sequence of the audio/acoustic signal, obtains a sequence made up of the numbers of bits such that the number of bits is smaller for a sample whose envelope value or the like is smaller, and encodes the samples of the frequency spectrum sequence of the audio/acoustic signal with the obtained numbers of bits.

PRIOR ART LITERATURE

Non-Patent Literature

Non-patent literature 1: R. Zelin ski and P. Noll, "Adaptive transform coding of speech signals," in IEEE Transactions on Acoustics, Speech, and Signal Processing, vol. 25, no. 4, pp. 299-309, August 1977.

SUMMARY OF THE INVENTION

Problems to be Solved by the Invention

The technique described in Non-patent literature 1 can compress while suppressing distortion under a high bit rate condition, but has a problem in which compression efficiency is reduced under a low bit rate condition because only the number of bits of an integer value of one or more can be assigned per sample of a frequency spectrum, and distortion of a decoded sample sequence with respect to an average number of bits assigned to the sample sequence increases.

An object of the present invention is to realize encoding and decoding that substantially assign the number of bits of a decimal fraction value per sample.

Means to Solve the Problems

In order to solve the above problems, an encoder according to a first aspect of the present invention comprises an integer selector that, for a set of L (L is an integer of three or more) input integer values (hereinafter referred to as "input integer values"), selects M (M is an integer of two or more and less than L) integer values (hereinafter referred to as "selected integer values") from the L input integer values, and obtains J-value (J is an integer of two or more) selection information that specifies which of the L input integer values the selected M selected integer values are, an integer integrator that obtains one integer value (hereinafter referred to as "converted integer value") by reversibly converting the M selected integer values and an integer value corresponding to the J-value selection information, and an integer encoder that encodes the converted integer value to obtain a code.

In order to solve the above problems, a decoder according to a second aspect of the present invention comprises an integer decoder that decodes a code to obtain one integer value (hereinafter referred to as "converted integer value"), an integer separator that obtains M (M is an integer of two or more) integer values (hereinafter referred to as "selected integer values") and J-value (J is an integer of two or more) selection information from the one converted integer value by reversible conversion, and an integer set restorer that sets the M selected integer values as M output integer values specified by the selection information among L (L is an integer larger than M) integer values (hereinafter referred to as "output integer values"), sets 0 as L−M remaining output integer values, and obtains a set of the L output integer values.

Effects of the Invention

According to the present invention, it is possible to realize encoding and decoding that substantially assign the number of bits of a decimal fraction value per sample.

DETAILED DESCRIPTION OF THE EMBODIMENTS

Figure 1:
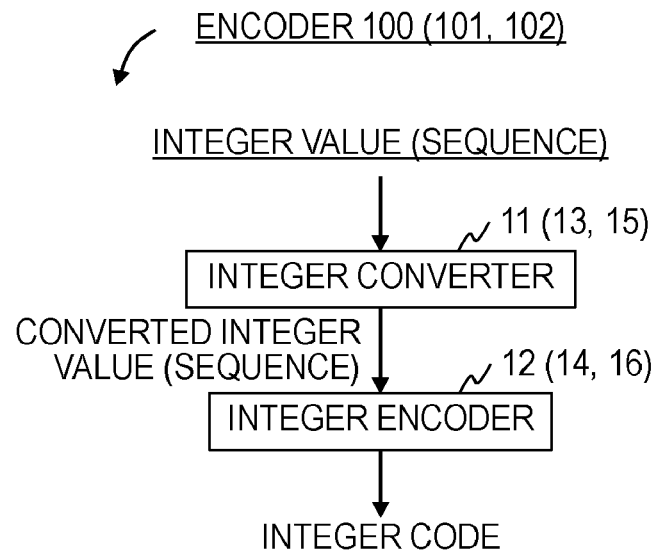
FIG. 1 is a diagram exemplifying a functional configuration of an encoder.

Hereinafter, embodiments of the invention will be described in detail. Note that in the drawings, components having the same functions are denoted by the same reference numerals and redundant description will be omitted.

A symbol "^" used in the text should be written just above a character immediately after it, but due to restrictions on text notation, will be written immediately before the character. In formulas, the symbol will be written in the original position, that is, just above the character.

First Embodiment

<<Encoder>>

Figure 2:
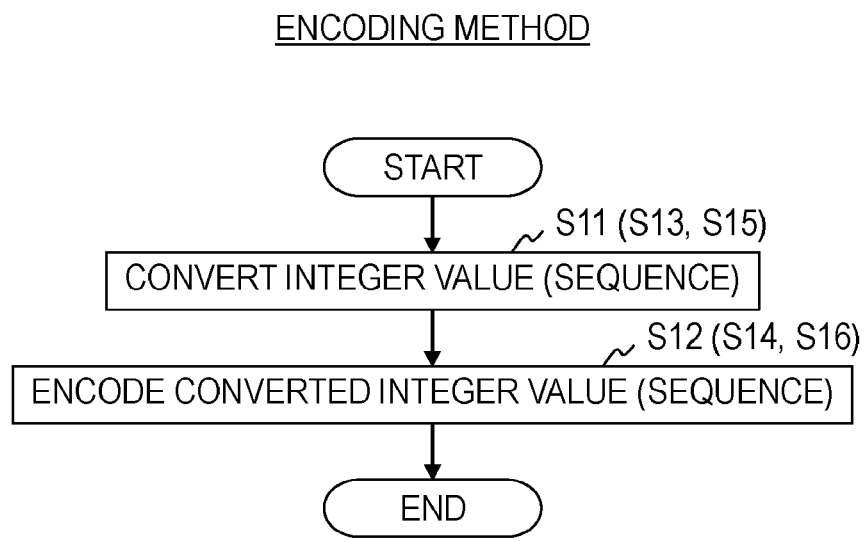
FIG. 2 is a diagram exemplifying a processing procedure of an encoding method.

A processing procedure of an encoding method performed by an encoder according to a first embodiment will be described with reference to FIGS. 1 and 2. An encoder 100 according to the first embodiment comprises, for example, an integer converter 11 and an integer encoder 12 as shown in FIG. 1. The encoder 100 performs processes of step S11 and step S12 shown in FIG. 2 and thereby the encoding method according to the first embodiment is implemented.

A sequence of integer values is input into the encoder 100 according to the first embodiment. As the sequence of integer values, a sequence of finite precision values may be input that are obtained by quantizing, by existing techniques, part or all of, for example, a signal obtained by converting voice or music collected by a microphone into a digital signal of a time domain or frequency domain, or a signal obtained by converting an image or a video captured with a camera into a digital signal of the time domain or frequency domain. More specifically, for example, it is a sequence of integer values obtained by converting a sound signal in the time domain into a 3N-point (N is a positive integer) MDCT coefficient sequence in the frequency domain in frame units of a predetermined time length and converting coefficients of the MDCT coefficient sequence into non-negative integer values, or a sequence of integer values obtained by converting sample values in frame units of a predetermined time length for a sound signal in the time domain into non-negative integer values.

The encoder 100 according to the first embodiment selects two integer values from three integer values for each of sets of three integer values (hereinafter also referred to as integer sets) in a sequence of input non-negative integer values, obtains selection information specifying the selected integer values, obtains one integer value by reversibly converting (conversion that can be inversely converted) a set of the two integer values and the selection information, encodes each integer value included in a sequence of the obtained integer value with an integer bit number of one or more bits, and thereby implement encoding processing of substantially assigning the number of bits of a decimal fraction value per sample of each of the non-negative integer values input into the encoder 100.

[Integer Converter 11]

Figure 3:
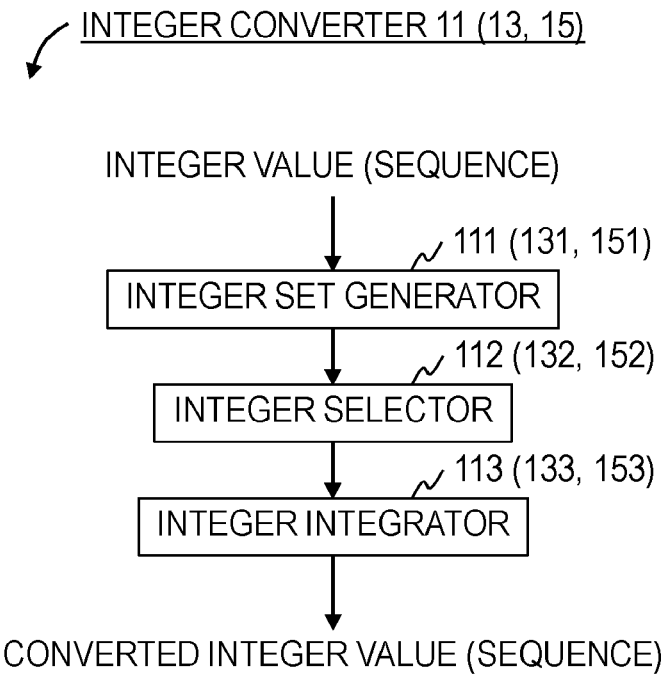
FIG. 3 is a diagram exemplifying a functional configuration of an integer converter.
Figure 4:
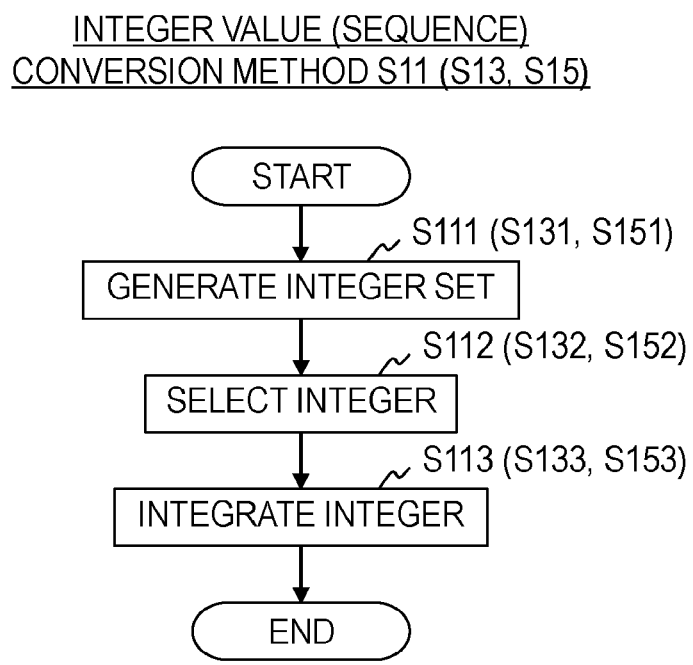
FIG. 4 is a diagram exemplifying a processing procedure of a conversion method of integer values (sequence)

A sequence of integer values of sets each made up of 3N samples (N is a natural number) of the sequence of integer values input into the encoder 100 is input into the integer converter 11. The input sequence of integer values is represented by an integer sequence $x\_1, x\_2, \ldots, x\_3N$. The integer converter 11 obtains a sequence $y\_1, y\_2, \ldots, y\_N$ of N integer values from the input integer sequence $x\_1, x\_2, \ldots, x\_3N$ and outputs it to the integer encoder 12 (step S11). The integer converter 11 includes, for example, an integer set generator 111, an integer selector 112, and an integer integrator 113 as shown in FIG. 3, and performs processes of step S111, step S112, and step S113 as shown in FIG. 4.

[[Integer Set Generator 111]]

The integer set generator 111 obtains N integer sets each made up of three integer values from the input integer sequence $x\_1, x\_2, \ldots, x\_3N$ according to a predetermined rule, and outputs them to the integer selector 112 (step S111). The predetermined rule for obtaining N integer sets may be any rule as long as the rule is predetermined and pre-stored in the encoder 100 and a decoder 200 described later, such as a rule that sets three consecutive integer values in the input integer sequence $x\_1, x\_2, \ldots, x\_3N$ to an integer set, that is, a rule that sets each of $x\_1$ and $x\_2$ and $x\_3$, $x\_4$ and $x\_5$ and $x\_6$, $\ldots$, and $x\_3N-2$ and $x\_3N-1$ and $x\_3N$ to an integer set.

[[Integer Selector 112]] The integer selector 112 selects two integer values from the three integer values for each of the input integer sets, and outputs a first integer value and a second integer value which are the selected two integer values and selection information which is information specifying the selected ones to the integer integrator 113 (step S112).

Specifically, the integer selector 112 selects an integer value having the smallest sample number from the three integer values as the first integer value for each of the input integer sets. In addition, the integer selector 112 selects an integer value having the larger value from two integer values having larger sample numbers of the three integer values as the second integer value. Furthermore, the integer selector 112 obtains 0 as selection information if the second integer value is one having the larger sample number of the two integer values having the larger sample numbers of the three integer values, and obtains 1 as selection information if the second integer value is one having the smaller sample number of the two integer values having the larger sample numbers of the three integer values. Note that if the two integer values having the larger sample numbers of the three integer values are equal, the integer selector 112 sets the equal integer value as the second integer value and obtains 0 as selection information. In this case, 1 may be obtained as selection information. Note that the selection information may be any information as long as the information indicates which integer value is selected from the two integer values having the larger sample numbers of the three integer values, but here, it is assumed that the selection information is obtained as 0 or 1 so as to match Formula (1) calculated by the integer integrator 113 described later.

For example, in the case of the integer set of $x\_1$ and $x\_2$ and $x\_3$, the integer selector 112 selects $x\_1$ whose sample number is the smallest as the first integer value. Then, the integer selector 112 selects an integer value having the larger value from $x\_2$ and $x\_3$ as the second integer value. Furthermore, the integer selector 112 obtains 0 as selection information when the second integer value is x_3, and obtains 1 as selection information when the second integer value is x_2. If x_2 and x_3 are equal, the integer selector 112 sets the equal integer value x_2=x_3 as the second integer value and obtains 0 as selection information.

When two integer values are freely selected from an integer set of three integer values, there are three options. However, the above-described method limits the options to two by adopting a configuration of selecting one integer value from the three integer values by the predetermined rule and selecting one integer value from the remaining two integer values, and reduces an amount of information of the selection information. That is, the integer selector 112 performs an operation including selecting one integer value from the two integer values and obtaining binary selection information representing which of the two integer values the selected one integer value is.

According to the configuration, for example, when an integer sequence input into the integer converter 11 is a sequence in a low-frequency order based on integer values obtained by converting each coefficient of an MDCT coefficient sequence in the frequency domain into a non-negative integer value, an integer value of the lowest frequency that has the highest possibility of a large value in the integer set is surely selected, and an integer value having the larger value is selected from the two integer values having higher frequencies. Thereby, it can be expected that distortion of a decoded signal by MDCT coefficients that are not selected nor encoded by the encoder 100 and as a result decoded values cannot be obtained by the decoder 200 described later will be reduced.

[[Integer Integrator 113]]

The integer integrator 113 obtains one integer value from the input first integer value, second integer value, and selection information by reversible conversion (conversion that can be inversely converted) for each integer set, and outputs it to the integer encoder 12 (step S113).

For example, the integer integrator 113 obtains one integer value y by Formula (1), where $x_1$ denotes an input first integer value, $x_2$ denotes an input second integer value, and s denotes input selection information. Hereinafter, the integer value y is referred to as converted integer value.

$$y = 2(\max(x_1, x_2))^2 + 2\min(x_1, x_2) + a) - s \begin{cases} \text{if } x_1 < x_2 & a = 1 \\ \text{otherwise} & a = 0 \end{cases} \quad (1)$$

The selection information s is subtracted in Formula (1), but the selection information s may be added. Formula (1) is a method for obtaining one converted integer value from the first integer value, the second integer value, and an integer value (0 or 1) corresponding to the selection information s by reversible conversion that can be expressed algebraically, but conversion performed by the integer integrator 113 does not necessarily need to be conversion that can be expressed algebraically, and may be any conversion as long as it is a method for obtaining one converted integer value from the first integer value, the second integer value, and a binary integer value corresponding to the selection information s by reversible conversion, that is, conversion that can be inversely converted. However, taking into consideration encoding processing of the integer encoder 12 described later, the conversion performed by the integer integrator 113 is desirable to be conversion that obtains a smaller converted integer value as the first integer value is smaller, obtains a smaller converted integer value as the second integer value is smaller, and obtains a smaller converted integer value as much as possible like Formula (1).

If the rule is to set three consecutive integer values to an integer set, the integer integrator 113 obtains a converted integer value y_1 from the integer set of x_1 and x_2 and x_3 among the integer sequence x_1, x_2, . . . , x_3N input into the integer converter 11, obtains a converted integer value y_2 from the integer set of x_4 and x_5 and x_6, . . . , obtains a converted integer value y_N from the integer set of x_3N−2 and x_3N−1 and x_3N, and outputs a converted integer sequence y_1, y_2, . . . , y_N which is a sequence of the obtained converted integer values.

Note that when N=1, the integer converter 11 obtains one integer value for the set of the input three integer values, and outputs the obtained one integer value as a converted integer value.

[Integer Encoder 12]

The converted integer sequence y_1, y_2, . . . , y_N output by the integer converter 11 is input into the integer encoder 12. The integer encoder 12 encodes the converted integer values included in the converted integer sequence y_1, y_2, . . . , y_N, obtains codes C_1, C_2, . . . , C_N for the respective converted integer values, and outputs a code group of the obtained codes as an integer code (step S12).

A method for encoding the converted integer values may be any method as long as it is a method for obtaining a code for each of the converted integer values included in the converted integer sequence y_1, y_2, . . . , y_N, and, for example, the integer encoder 12 determines the number of bits to be assigned to each converted integer value included in the converted integer sequence y_1, y_2, . . . , y_N, encodes each converted integer value with the determined number of bits, and outputs the code group of the obtained codes C_1, C_2, . . . , C_N as the integer code. More specifically, the integer encoder 12 obtains a code in which each converted integer value included in the converted integer sequence y_1, y_2, . . . , y_N is represented by a binary number, fits the obtained each code into the determined number of bits to make the codes C_1, C 2, . . . , C_N, and outputs the code group of the codes C_1, C_2, . . . , C_N as the integer code.

<<Decoder>>

Figure 5:
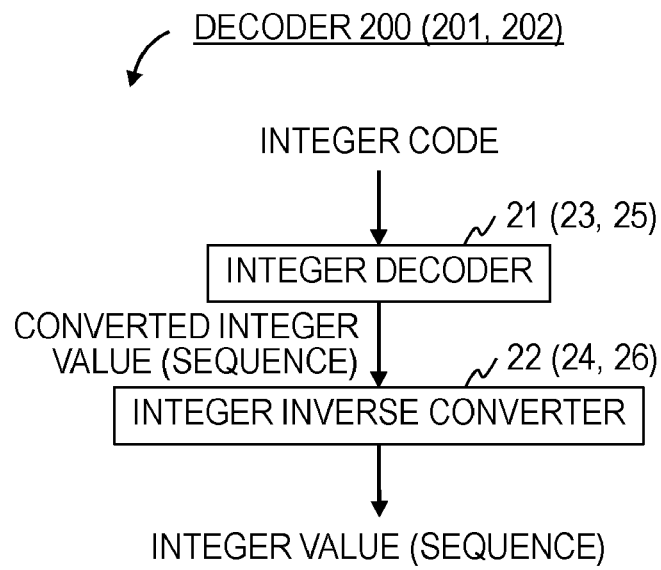
FIG. 5 is a diagram exemplifying a functional configuration of a decoder.
Figure 6:
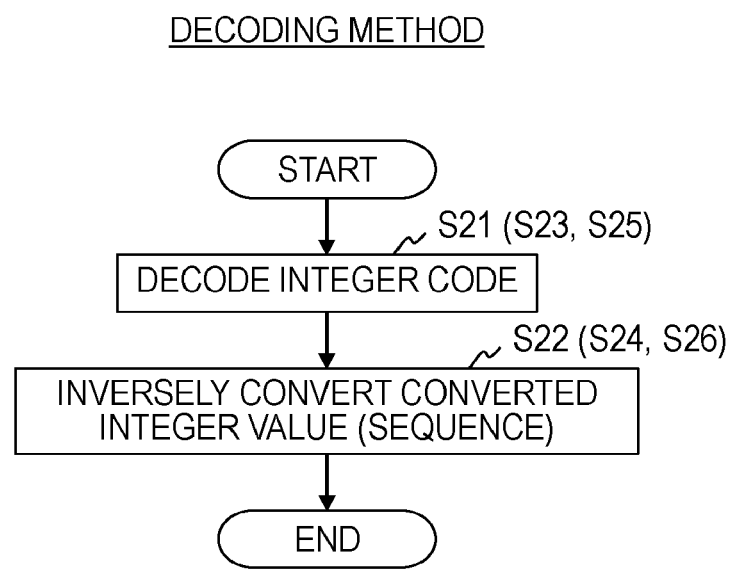
FIG. 6 is a diagram exemplifying a processing procedure of a decoding method.

A processing procedure of a decoding method performed by a decoder according to the first embodiment will be described with reference to FIGS. 5 and 6. The decoder 200 according to the first embodiment comprises, for example, an integer decoder 21 and an integer inverse converter 22 as shown in FIG. 5. The decoder 200 performs processes of step S21 and step S22 shown in FIG. 6 and thereby the decoding method according to the first embodiment is implemented.

The integer code output by the encoder 100 according to the first embodiment is input into the decoder 200 according to the first embodiment. The decoder 200 according to the first embodiment decodes the input integer code by decoding processing corresponding to the encoder 100 according to the first embodiment to obtain a sequence of integer values, performs inverse conversion corresponding to the conversion performed by the encoder 100 according to the first embodiment for each integer value in the obtained sequence of integer values to obtain two integer values of the three integer values input into the encoder 100, and thereby correctly restores two-thirds integer values of the sequence of integer values input into the encoder 100 according to the first embodiment.

[Integer Decoder 21]

The integer code input into the decoder 200 is input into the integer decoder 21 by N (N is a natural number) codes at a time. Here, the input integer codes are assumed to be C_1, C_2, ..., C_N. The integer decoder 21 decodes each of the input integer codes C_1, C 2, ..., C_N to obtain integer values y_1, y_2, ..., y_N, and outputs a sequence of the obtained integer values to the integer inverse converter 22 as a converted integer sequence y_1, y_2, ..., y_N (step S21). The method for decoding each integer code is a decoding method corresponding to the encoding method performed by the integer encoder 12 of the corresponding encoder 100. That is, the method for decoding each integer code is a method for obtaining an integer value for each code C_1, C_2, ..., C_N included in the integer code, and a method for obtaining one integer value for one code. For example, the integer decoder 21 obtains a binary number represented by each code C_1, C_2, ..., C_N included in the integer code as each integer value y_1, y_2, ..., y_N, and outputs a sequence of the obtained integer values to the integer inverse converter 22 as a converted integer sequence y_1, y_2, ..., y_N. Each integer value y_1, y_2, ..., y_N is also referred to as converted integer value.

[Integer Inverse Converter 22]

Figure 7:
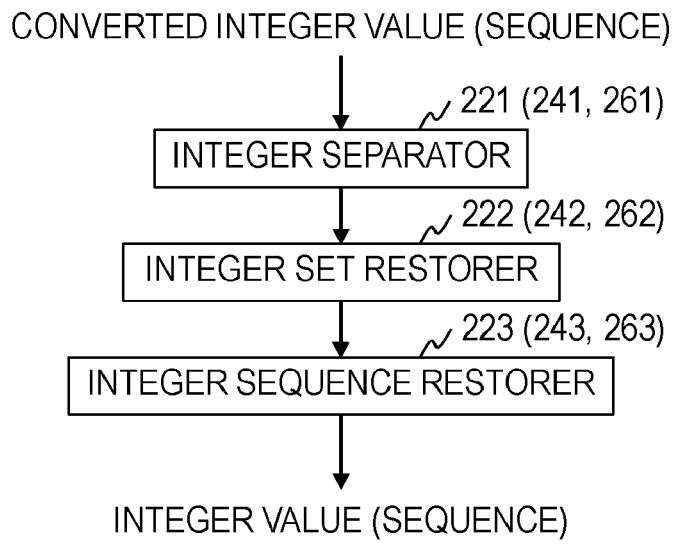
FIG. 7 is a diagram exemplifying a functional configuration of an integer inverse converter.
Figure 8:
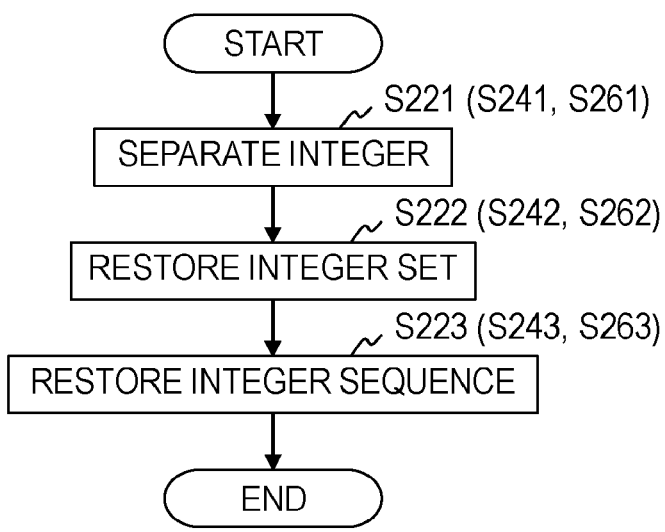
FIG. 8 is a diagram exemplifying a processing procedure of an inverse conversion method of converted integer values (sequence).

The converted integer sequence y_1, y_2, ..., y_N output by the integer decoder 21 is input into the integer inverse converter 22. The integer inverse converter 22 obtains and outputs an integer sequence x_1, x_2, ..., x_3N from the input converted integer sequence y_1, y_2, ..., y_N (step S22). The integer inverse converter 22 includes, for example, an integer separator 221, an integer set restorer 222, and an integer sequence restorer 223 as shown in FIG. 7, and performs processes of step S221, step S222, and step S223 shown in FIG. 8.

[[Integer Separator 221]]

The integer separator 221 performs inverse conversion corresponding to the conversion performed by the integer integrator 113 of the encoder 100 according to the first embodiment for each converted integer value y_1, y_2, ..., y_N included in the converted integer sequence, obtains a first integer value $x_1$ and a second integer value $x_2$ that are two integer values and selection information s, and outputs them to the integer set restorer 222 (step S221).

For example, when the integer integrator 113 of the encoder 100 according to the first embodiment performs conversion of Formula (1), the integer separator 221 obtains the first integer value $x_1$, second integer value $x_2$, and selection information s from one integer value y by Formulas (2) and (3) as inverse conversion of the conversion of Formula (1).

$$\text{if } y \text{ is even} \quad (2)$$

$$y' = \frac{y}{2}$$

$$s = 0$$

otherwise $$y' = \frac{y+1}{2}$$

$$s = 1$$

$$\text{if } y' - \lfloor \sqrt{y'} \rfloor^2 \text{ is even} \quad (3)$$

$$x_1 = \lfloor \sqrt{y'} \rfloor$$

-continued $$x_2 = \frac{(y' - \lfloor \sqrt{y'} \rfloor^2)}{2}$$

otherwise $$x_1 = \frac{(y' - \lfloor \sqrt{y'} \rfloor^2 - 1)}{2}$$

$$x_2 = \lfloor \sqrt{y'} \rfloor^2$$

Here, $$\lfloor \sqrt{y'} \rfloor$$

in Formula (3) is a floor function of square root of y', that is, the largest integer that does not exceed the square root of y'.

The integer separator 221 may perform, for example, a procedure of Steps A-1 to A-3-1 or Steps A-1 to A-2 and A-3-2 described below instead of arithmetic of Formula (3).

Step A-1: to obtain the largest integer b that does not exceed the square root of y'.

Step A-2: to find square of b ($b^2$).

Step A-3-1: if difference between y' and the square of b is an even number, that is, y'−$b^2$ is even, to obtain b as the integer value $x_1$ and obtain, as the integer value $x_2$, a value (y'−$b^2$)/2 obtained by dividing by 2 a value obtained by subtracting the square of b from y'.

Step A-3-2: if the difference between y' and the square of b is an odd number, that is, y'−$b^2$ is odd, to obtain b as the integer value $x_2$ and obtain, as the integer value $x_1$, a value (y'−$b^2$−1)/2 obtained by dividing by 2 a value obtained by subtracting the square of b and 1 from y'.

The conversion by Formulas (2) and (3) is inverse conversion of the conversion of Formula (1) and a method for obtaining the first integer value, second integer value, and integer value (0 or 1) corresponding to the selection information from one converted integer value by reversible conversion that can be expressed algebraically, but the conversion performed by the integer separator 221 does not necessarily need to be conversion that can be expressed algebraically and may be any conversion as long as it is reversible conversion, and inverse conversion of the conversion performed by the integer integrator 113 of the encoder 100, and a method for obtaining the first integer value, second integer value, and binary integer value corresponding to the selection information from one converted integer value. Note that when the integer integrator 113 of the encoder 100 performs addition instead of subtraction of the selection information s in Formula (1), the integer separator 221 should perform the following Formula (2') instead of Formula (2).

$$\text{if } y \text{ is even} \quad (2')$$

$$y' = \frac{y}{2}$$

$$s = 0$$

otherwise $$y' = \frac{y-1}{2}$$

$$s = 1$$

[[Integer Set Restorer 222]]

For each converted integer value $y\_1, y\_2, \ldots, y\_N$ included in the converted integer sequence input into the integer inverse converter 22, the integer set restorer 222 obtains an integer set of three integer values from the first integer value $x_1$, second integer value $x_2$, and selection information s (binary integer value) input from the integer separator 221 by processing corresponding to the processing performed by the integer selector 112 of the encoder 100, and outputs it to the integer sequence restorer 223 (step S222).

Specifically, for each converted integer value $y\_1, y\_2, \ldots, y\_N$ included in the converted integer sequence input into the integer inverse converter 22, the integer set restorer 222 sets the input first integer value $x_1$ as an integer value having the smallest sample number of the integer set of three integer values. If the selection information is 0, the integer set restorer 222 sets the input second integer value $x_2$ as an integer value having the largest sample number of the integer set of three integer values, and sets 0 as an integer value having the second largest sample number of the integer set of three integer values, whereas if the selection information is 1, the integer set restorer 222 sets the input second integer value $x_2$ as an integer value having the second largest sample number of the integer set of three integer values, and sets 0 as an integer value having the largest sample number of the integer set of three integer values.

For example, when the integer set of $x\_1, x\_2$, and $x\_3$ is obtained from $y\_1$, the integer set restorer 222 sets the input first integer value $x_1$ as $x\_1$ having the smallest sample number. In addition, when the selection information is 0, the integer set restorer 222 sets the input second integer value $x_2$ as $x\_3$ and 0 as $x\_2$, whereas when the selection information is 1, it sets the input second integer value $x_2$ as $x\_2$ and 0 as $x\_3$.

The operation of the integer set restorer 222 includes an operation of obtaining two integer values from one integer value and binary selection information representing which of the two integer values the one integer value is, since it is an operation corresponding to the operation including, in order to reduce the amount of information on the selection information by limiting options to two, the integer selector 112 of the encoder 100 selecting one integer value from two integer values and obtaining binary selection information representing which of the two integer values the selected one integer value is.

[[Integer Sequence Restorer 223]]

The integer sequence restorer 223 obtains and outputs an integer sequence $x\_1, x\_2, \ldots, x\_3N$ from N integer sets each made up of three integer values input from the integer set restorer 222 for the converted integer values $y\_1, y\_2, \ldots, y\_N$ included in the converted integer sequence input into the integer inverse converter 22 according to a rule corresponding to the rule performed by the integer set generator 111 of the encoder 100 according to the first embodiment (step S223).

When the rule performed by the integer set generator 111 of the encoder 100 according to the first embodiment is a rule that sets three consecutive integer values to an integer set, the integer set restorer 222 obtains an integer set of the integer value $x\_1$, integer value $x\_2$, and integer value $x\_3$ from the converted integer $y\_1$ of the input converted integer sequence $y\_1, y\_2, \ldots, y\_N$, obtains an integer set of the integer value $x\_4$, integer value $x\_5$, and integer value $x\_6$ from the converted integer $y\_2, \ldots$, and obtains an integer set of the integer value $x\_3N-2$, integer value $x\_3N-1$, and integer value $x\_3N$ from the converted integer $y\_N$, and the integer sequence restorer 223 obtains and outputs an integer sequence $x\_1, x\_2, \ldots, x\_3N$ which is a sequence of the integer sets obtained by the integer set restorer 222.

Second Embodiment

In the encoder 100 according to the first embodiment, the integer selector 112 performs the operation including selecting one integer value from two integer values and obtaining binary selection information representing which of the two integer values the selected one integer value is, but the integer selector of the encoder may perform an operation including selecting one integer value from three or more integer values, and obtaining three- or more-value selection information representing which of the three or more integer values the selected one integer value is. In the same manner, the integer set restorer of the decoder may perform an operation including obtaining three or more integer values from one integer value and three- or more-value selection information representing which of the three or more integer values the one integer value is.

In a second embodiment, as one form of this, description will be made on an encoder that includes an operation in which, for each of sets of S+1 (S is an integer of two or more) integer values in a sequence of input non-negative integer values, an integer selector selects one integer value from S integer values and obtains S-value selection information representing which of the S integer values the selected one integer value is, and a decoder corresponding to this, that is, a decoder that includes an operation in which an integer set restorer obtains S integer values from one integer value and S-value selection information representing which of the S integer values the one integer value is. Note that the first embodiment corresponds to the case where S is 2 in the second embodiment.

<<Encoder>>

A processing procedure of an encoding method performed by the encoder according to the second embodiment will be described with reference to FIGS. 1 and 2. An encoder 101 according to the second embodiment comprises, for example, an integer converter 13 and an integer encoder 14 as in the encoder according to the first embodiment. The encoder 101 performs processes of step S13 and step S14 shown in FIG. 2 and thereby the encoding method according to the second embodiment is implemented. Because an operation of the integer encoder 14 of the encoder 101 according to the second embodiment and a process of step S14 performed by the integer encoder 14 are the same as the operation of the integer encoder 12 of the encoder 100 according to the first embodiment and the process of step S12 performed by the integer encoder 12, only the integer converter 13 that operates differently from that according to the first embodiment will be described here.

A sequence of integer values as in the encoder 100 according to the first embodiment is input into the encoder 101 according to the second embodiment. More specifically, for example, it is a sequence of integer values obtained by converting a sound signal in the time domain in frame units of a predetermined time length into a (S+1)N-point ((S+1)×N point) MDCT coefficient sequence in the frequency domain and converting coefficients of the MDCT coefficient sequence into non-negative integer values, or a sequence of integer values obtained by converting each sample value of a sound signal in the time domain in frame units of a predetermined time length into non-negative integer values.

[Integer Converter 13]

A sequence of integer values made up of sets of (S+1)N samples of the sequence of integer values input into the encoder 101 is input into the integer converter 13. The input sequence of integer values is represented by an integer sequence $x\_1, x\_2, \ldots, x\_((S+1)N)$. The integer converter 13 obtains a sequence $y\_1, y\_2, \ldots, y\_N$ of N integer values from the input integer sequence $x\_1, x\_2, \ldots, x\_((S+1)N)$ and outputs it to the integer encoder 14 (step S13). The integer converter 13 includes, for example, an integer set generator 131, an integer selector 132, and an integer integrator 133 as shown in FIG. 3, and performs processes of step S131, step S132, and step S133 as shown in FIG. 4.

[[Integer Set Generator 131]] The integer set generator 131 obtains N integer sets each made up of S+1 integer values from the input integer sequence $x\_1, x\_2, \ldots, x\_((S+1)N)$ according to a predetermined rule, and outputs them to the integer selector 132 (step S131). The predetermined rule for obtaining N integer sets may be any rule as long as the rule is predetermined and pre-stored in the encoder 101 and a decoder 201 described later, such as a rule that sets S+1 consecutive integer values in the input integer sequence $x\_1, x\_2, \ldots, x\_((S+1)N)$ to an integer set, that is, a rule that sets each of $x\_1$ to $x\_(S+1)$, $x\_(S+2)$ to $x\_((S+1)2), \ldots$, and $x\_((S+1)(N-1)+1)$ to $x\_((S+1)N)$ to an integer set.

[[Integer Selector 132]]

The integer selector 132 selects two integer values from the S+1 integer values for each of the input integer sets, and outputs a first integer value and a second integer value which are the selected two integer values and selection information which is information specifying the selected ones to the integer integrator 133 (step S132).

Specifically, the integer selector 132 selects an integer value having the smallest sample number from the S+1 integer values as the first integer value for each of the input integer sets. In addition, the integer selector 132 selects an integer value having the largest value from S integer values having larger sample numbers among the S+1 integer values as the second integer value. Furthermore, the integer selector 132 obtains 0 as selection information if the second integer value is one having the largest sample number of the S integer values having the larger sample numbers among the S+1 integer values, obtains 1 as selection information if the second integer value is one having the second largest sample number of the S integer values having the larger sample numbers among the S+1 integer values, ..., and obtains S−1 as selection information if the second integer value is one having the smallest sample number of the S integer values having the larger sample numbers among the S+1 integer values.

Note that if the S integer values having the larger sample numbers among the S+1 integer values include a plurality of ones having the largest value, the integer selector 132 sets the largest value which the plurality of integer values have as the second integer value and obtains a value representing the largest sample number among the plurality of integer values having the largest value as selection information. For example, if integer values having the largest value of the S integer values having the larger sample numbers among the S+1 integer values are two integer values having the second largest sample number and the third largest sample number, 1 representing the second largest sample number is obtained as selection information. However, in this case, a value representing any sample number of the plurality of integer values having the largest value may be obtained as selection information.

For example, in the case of four consecutive integer values are set as an integer set, for an integer set of $x\_1$ and $x\_2$ and $x\_3$ and $x\_4$, the integer selector 132 selects $x\_1$ whose sample number is the smallest as the first integer value. Then, the integer selector 132 selects an integer value having the largest value from $x\_2$ and $x\_3$ and $x\_4$ as the second integer value. Furthermore, the integer selector 132 obtains 0 as selection information when the second integer value is $x\_4$, obtains 1 as selection information when the second integer value is $x\_3$, and obtains 2 as selection information when the second integer value is $x\_2$. If two, $x\_3$ and $x\_4$, of $x\_2$ and $x\_3$ and $x\_4$ have the largest value, the integer selector 132 sets the equal integer value $x\_3=x\_4$ as the second integer value and obtains 0 as selection information.

When two integer values are freely selected from an integer set of S+1 integer values, there are $_{S+1}C_2$ options. However, the above-described method limits the options to $_SC_1=S$ by adopting a configuration of selecting one integer value from the S+1 integer values by the predetermined rule and selecting one integer value from the remaining S integer values, and reduces an amount of information of selection information. That is, the integer selector 132 performs an operation including selecting one integer value from the S integer values and obtaining S-value selection information representing which of the S integer values the selected one integer value is.

[[Integer Integrator 133]]

The integer integrator 133 obtains one integer value from the input first integer value, second integer value, and selection information by reversible conversion (conversion that can be inversely converted) for each integer set, and outputs it to the integer encoder 14 (step S133).

For example, the integer integrator 133 obtains one integer value y by Formula (4), where $x_1$ denotes an input first integer value, $x_2$ denotes an input second integer value, and s denotes input selection information.

$$y = S(\max(x_1, x_2)^2 + 2\min(x_1, x_2) + a) - s \begin{cases} \text{if } x_1 < x_2 & a = 1 \\ \text{otherwise} & a = 0 \end{cases} \quad (4)$$

The selection information s is subtracted in Formula (4), but the selection information s may be added. Formula (4) is a method for obtaining one converted integer value from the first integer value, the second integer value, and an integer value (any of 0 to S−1) corresponding to the selection information s by reversible conversion that can be expressed algebraically, but conversion performed by the integer integrator 133 does not necessarily need to be conversion that can be expressed algebraically, and may be any conversion as long as it is a method for obtaining one converted integer value from the first integer value, the second integer value, and an S-value integer value corresponding to the selection information s by reversible conversion, that is, conversion that can be inversely converted. However, taking into consideration encoding processing of the integer encoder 14, the conversion performed by the integer integrator 133 is desirable to be conversion that obtains a smaller converted integer value as the first integer value is smaller, obtains a smaller converted integer value as the second integer value is smaller, and obtains a smaller converted integer value as much as possible like Formula (4).

For example, if the rule is to set four consecutive integer values to an integer set, the integer integrator 133 obtains a converted integer value y_1 from an integer set of x_1 and x_2 and x_3 and x_4 of the integer sequence x_1, x_2, ..., x_4N input into the integer converter 13, obtains a converted integer value y_2 from an integer set of x_5 and x_6 and x_7 and x_8, ..., obtains a converted integer value y_N from an integer set of x_4N−3 and x_4N−2 and x_4N−1 and x_4N, and outputs a converted integer sequence y_1, y_2, ..., y_N which is a sequence of the obtained converted integer values.

Note that when N=1, the integer converter 13 obtains one integer value for the set of input (S+1) integer values, and outputs the obtained one integer value as a converted integer value.

<<Decoder>>

A processing procedure of a decoding method performed by the decoder according to the second embodiment will be described with reference to FIGS. 5 and 6. A decoder 201 according to the second embodiment comprises, for example, an integer decoder 23 and an integer inverse converter 24 as in the decoder according to the first embodiment. The decoder 201 performs processes of step S23 and step S24 shown in FIG. 6 and thereby the decoding method according to the second embodiment is implemented.

The integer code output by the encoder 101 according to the second embodiment is input into the decoder 201 according to the second embodiment. The decoder 201 according to the second embodiment decodes the input integer code by decoding processing corresponding to the encoder 101 according to the second embodiment to obtain a sequence of integer values, performs inverse conversion corresponding to the conversion performed by the encoder 101 according to the second embodiment for each integer value in the obtained sequence of integer values to obtain two integer values among the S+1 integer values input into the encoder 101, and thereby correctly restores two of (S+1) integer values of the sequence of integer values input into the encoder 101 according to the second embodiment.

Because an operation of the integer decoder 23 of the decoder 201 according to the second embodiment and a process of step S23 performed by the integer decoder 23 are the same as the operation of the integer decoder 21 of the decoder 200 according to the first embodiment and the process of step S21 performed by the integer decoder 21, only the integer inverse converter 24 that operates differently from that according to the first embodiment will be described here.

[Integer Inverse Converter 24]

The converted integer sequence y_1, y_2, ..., y_N output by the integer decoder 23 is input into the integer inverse converter 24. The integer inverse converter 24 obtains and outputs an integer sequence x_1, x_2, ..., x_((S+1)N) from the input converted integer sequence y_1, y_2, ..., y_N (step S24). The integer inverse converter 24 includes, for example, an integer separator 241, an integer set restorer 242, and an integer sequence restorer 243 as shown in FIG. 7, and performs processes of step S241, step S242, and step S243 shown in FIG. 8.

[[Integer Separator 241]]

The integer separator 241 performs inverse conversion corresponding to the conversion performed by the integer integrator 133 of the encoder 101 according to the second embodiment for each converted integer value y_1, y_2, ..., y_N included in the converted integer sequence, obtains a first integer value $x_1$ and a second integer value $x_2$ that are two integer values and selection information s, and outputs them to the integer set restorer 242 (step S241).

For example, when the integer integrator 133 of the encoder 101 according to the second embodiment performs conversion of Formula (4), the integer separator 241 obtains the first integer value $x_1$, the second integer value $x_2$, and a J-value integer value s corresponding to the selection information from the one integer value y by Formulas (5), (6), and (3) as inverse conversion of the conversion of Formula (4).

$$y' = \left\lfloor \frac{y + (S-1)}{S} \right\rfloor \quad (5)$$

$$s = Sy' - y \quad (6)$$

The integer separator 241 may perform, for example, the above-described procedure of Steps A-1 to A-3-1 or Steps A-1 to A-2 and A-3-2 instead of arithmetic of Formula (3).

The conversion by Formulas (5), (6), and (3) is inverse conversion of the conversion of Formula (4) and a method for obtaining the first integer value, second integer value, and S-value integer value s (any of 0 to S−1) corresponding to the selection information from one converted integer value by reversible conversion that can be expressed algebraically, but the conversion performed by the integer separator 241 does not necessarily need to be conversion that can be expressed algebraically and may be any conversion as long as it is reversible conversion, and inverse conversion of the conversion performed by the integer integrator 133 of the encoder 101, and a method for obtaining the first integer value, second integer value, and S-value integer value corresponding to the selection information from one converted integer value. Note that when the integer integrator 133 of the encoder 101 performs addition instead of subtraction of the selection information s in Formula (4), the integer separator 241 should perform the following Formulas (5') and (6') instead of Formulas (5) and (6).

$$y' = \left\lfloor \frac{y}{S} \right\rfloor \quad (5')$$

$$s = y' - Sy \quad (6')$$

[[Integer Set Restorer 242]]

For each converted integer value y_1, y_2, ..., y_N included in the converted integer sequence input into the integer inverse converter 24, the integer set restorer 242 obtains an integer set of S+1 integer values from the first integer value $x_1$, second integer value $x_2$, and selection information s (S-value integer value s corresponding to the selection information) input from the integer separator 241 by processing corresponding to the processing performed by the integer selector 132 of the encoder 101, and outputs it to the integer sequence restorer 243 (step S242).

Specifically, for each converted integer value y_1, y_2, ..., y_N included in the converted integer sequence input into the integer inverse converter 24, the integer set restorer 242 sets the input first integer value $x_1$ as one having the smallest sample number in the integer set of S+1 integer values. If the selection information is 0, the integer set restorer 242 sets the input second integer value $x_2$ as one having the largest sample number of the integer set of S+1 integer values, and sets 0 as remaining S−1 integer values of the integer set of S+1 integer values, whereas if the selection information is 1, the integer set restorer 242 sets the input second integer value $x_2$ as one having the second largest sample number of the integer set of S+1 integer values, and sets 0 as remaining S−1 ones of the integer set of S+1 integer values, . . . , and if the selection information is S−1, the integer set restorer 242 sets the input second integer value $x_2$ as one having the second smallest sample number of the integer set of S+1 integer values, sets 0 as remaining S−1 ones of the integer set of S+1 integer values.

For example, when the integer set of x_1 and x_2 and x_3 and x_4 is obtained from y_1, the integer set restorer 242 sets the first integer value $x_1$ as x_1 having the smallest sample number. In addition, when the selection information is 0, the integer set restorer 242 sets the input second integer value $x_2$ as x_4 and 0 as x_2 and x_3, when the selection information is 1, it sets the input second integer value $x_2$ as x_3 and 0 as x_2 and x_4, and when the selection information is 2, it sets the input second integer value $x_2$ as x_2 and 0 as x_3 and x_4.

[[Integer Sequence Restorer 243]]

The integer sequence restorer 243 obtains and outputs an integer sequence x_1, x_2, . . . , x_((S+1)N) from N integer sets each made up of S+1 integer values input from the integer set restorer 242 for the converted integer values y_1, y_2, . . . , y_N included in the converted integer sequence input into the integer inverse converter 24 according to a rule corresponding to the rule performed by the integer set generator 131 of the encoder 101 according to the second embodiment (step S243).

When the rule performed by the integer set generator 131 of the encoder 101 according to the second embodiment is a rule that sets S+1 consecutive integer values to an integer set, the integer set restorer 242 obtains an integer set of the integer value x_1 to the integer value x_(S+1) from the converted integer y_1 of the input converted integer sequence y_1, y_2, . . . , y_N, obtains an integer set of the integer value x_(S+2) to the integer value x_((S+1)2) from the converted integer y_2, . . . , and obtains an integer set of the integer value x_((S+1)(N−1)+1) to the integer value x_((S+1)N) from the converted integer y_N, and the integer sequence restorer 243 obtains and outputs an integer sequence x_1, x_2, . . . , x_((S+1)N) which is a sequence of the integer sets obtained by the integer set restorer 242.

Third Embodiment

In the second embodiment, the form is described that includes the operation in which the integer selector 132 of the encoder 101 selects one integer value from S (S is an integer of two or more) integer values and obtains S-value selection information representing which of the S integer values the selected one integer value is, and corresponding to this, includes the operation in which the integer set restorer 242 of the decoder 201 obtains S integer values from the S-value selection information representing which of the S integer values the one integer value is. On the contrary to this, the integer selector of the encoder may perform an operation of selecting M (M is an integer of two or more) integer values from L (L is an integer of three or more) integer values and obtaining J-value (J is an integer of two or more) selection information specifying which of the L integer values the selected M integer values are, and corresponding to this, the integer set restorer of the decoder may perform an operation of obtaining the L integer values from the J-value selection information specifying which of the L integer values the M integer values are. In a third embodiment, one form of this will be described.

<<Encoder>>

A processing procedure of an encoding method performed by an encoder according to the third embodiment will be described with reference to FIGS. 1 and 2. An encoder 102 according to the third embodiment comprises, for example, an integer converter 15 and an integer encoder 16 as in the encoder according to the second embodiment. The encoder 102 performs processes of step S15 and step S16 shown in FIG. 2 and thereby the encoding method according to the third embodiment is implemented.

Because an operation of the integer encoder 16 of the encoder 102 according to the third embodiment and a process of step S16 performed by the integer encoder 16 are the same as the operation of the integer encoder 14 of the encoder 101 according to the second embodiment and the process of step S14 performed by the integer encoder 14, only the integer converter 15 that operates differently from that according to the second embodiment will be described here.

A sequence of integer values as in the encoder 101 according to the second embodiment is input into the encoder 102 according to the third embodiment. More specifically, for example, it is a sequence of integer values obtained by converting coefficients of an LN-point (L×N point) MDCT coefficient sequence in the frequency domain in frame units of a predetermined time length for a sound signal in the time domain into non-negative integer values, or a sequence of integer values obtained by converting sample values in frame units of a predetermined time length for a sound signal in the time domain into non-negative integer values.

[Integer Converter 15]

A sequence of integer values made up of sets of LN samples of the sequence of integer values input into the encoder 102 is input into the integer converter 15. The input sequence of integer values is represented by an integer sequence x_1, x_2, . . . , x_LN. The integer converter 15 obtains a sequence y_1, y_2, . . . , y_N of N integer values from the input integer sequence x_1, x_2, . . . , x_LN and outputs it to the integer encoder 16 (step S15). The integer converter 15 includes, for example, an integer set generator 151, an integer selector 152, and an integer integrator 153 as shown in FIG. 3, and performs processes of step S151, step S152, and step S153 as shown in FIG. 4.

[[Integer Set Generator 151]]

The integer set generator 151 obtains N integer sets each made up of M integer values from the input integer sequence x_1, x_2, . . . , x_LN according to a predetermined rule, and outputs them to the integer selector 152 (step S151). The predetermined rule for obtaining N integer sets may be any rule as long as the rule is predetermined and pre-stored in the encoder 102 and a decoder 202 described later, such as a rule that sets L consecutive integer values in the input integer sequence x_1, x_2, . . . , x_LN to an integer set, that is, a rule that sets each of x_1 to x_L, x_(L+1) to x_2L, . . . , and x_(L(N−1)+1) to x_LN to an integer set.

[[Integer Selector 152]]

The integer selector 152 selects M integer values from the L integer values for each of the input integer sets, and outputs a first integer value to an Mth integer value which are the selected M integer values and J-value selection information specifying which of the L integer values the M integer values are to the integer integrator 153 (step S152).

First Example of Operation of Integer Selector 152

The integer selector 152 may perform the same operation as the integer selector 132 according to the second embodiment. In this case, the integer selector 152 sets L=S+1, M=2, and J=S, and the integer selector 152 performs the same operation as the integer selector 132 according to the second embodiment. In this case, the selection information is actually a value representing a sample number of one integer value selected from L−1=S integer values excluding an integer value having the smallest sample number among the L integer values. However, given that the purpose of the selection information is to enable the decoding side to identify which of the L integer values the M integer values are, it is possible to interpret that the predetermined rule is also included in the selection information. Therefore, the selection information can be said to be J=S-value selection information that specifies which of the L=S+1 integer values the M=2 integer values are.

When the integer selector 152 performs the same operation as the integer selector 132 according to the second embodiment, the selection information is any of integer values of 0 or more and J−1 or less, but it is not essential that the value of the selection information is set to an integer value of 0 or more and J−1 or less, and the integer selector 152 may obtain selection information which is any of predetermined J consecutive values. For example, the selection information may be an integer value of 1 or more and J or less, and may be an integer value of two or more and J+1 or less. Note that the reason why the selection information obtained by the integer selector 152 is set to any of the predetermined J consecutive integer values is to make conversion of, for example, Formula (7) performed by the integer integrator 153 described later reversible conversion. Therefore, when reversible conversion different from Formula (7) is performed, it is not essential that the selection information obtained by the integer selector 152 is set to any of the predetermined J consecutive integer values, and as described above, the selection information should be J-value information that specifies which of the L integer values the M integer values are.

Second Example of Operation of Integer Selector 152

The integer selector 152 may include multiple repetitions of the same operation as the integer selector 132 according to the second embodiment. In this case, for example, the integer selector 152 may set L=$S_1$+$S_2$+2 ($S_1$ and $S_2$ are positive integer of two or more), M=4, and J=4, and the integer selector 152 may perform the same operation as the integer selector 132 according to the second embodiment for $S_1$+1 integer values of the L integer values, select two integer values from the $S_1$+1 integer values and obtain binary selection information, and then the integer selector 152 may perform the same operation as the integer selector 132 according to the second embodiment for remaining $S_2$+1 integer values of the L integer values, select two integer values from the $S_2$+1 integer values and obtain binary selection information, and obtain the selected M=4 (2×2) integer values and J=4 value (2 values×2 values) selection information.

Third Example of Operation of Integer Selector 152

The integer selector 152 may freely select M integer values from the L integer values without including the predetermined rule different from the integer selector 132 according to the second embodiment. That is, the integer selector 152 may select M integer values from the L integer values, and output the selected M integer values and J=$_L C_M$ value selection information specifying which of the L integer values the M integer values are to the integer integrator 153.

Other Example and the Like of Operation of Integer Selector 152

Since there are many combinations, description is omitted, but the integer selector 152 may perform an operation in which the above-described first example and third example are combined or an operation in which the above-described second example and third example are combined. In short, the integer selector 152 may perform any operation as long as the integer selector 152 selects M integer values from L integer values for each input integer set, and outputs a first integer value to an Mth integer value which are the selected M integer values and J-value selection information specifying which of the L integer values the M integer values are to the integer integrator 153.

[[Integer Integrator 153]]

The integer integrator 153 obtains one integer value from the input M integer values of the first integer value to the Mth integer value and J-value selection information by reversible conversion (conversion that can be inversely converted) for each integer set, and outputs it to the integer encoder 16 (step S153).

For example, the integer integrator 153 sets the input first integer value to Mth integer value to $x_1$, $x_2$, ..., $x_M$, respectively, and the input J-value selection information to an integer value s from 0 to J−1, and obtains one integer value y by Formula (7).

$$Y = Jf_M(x_1, x_2, \ldots, x_M) - s \tag{7}$$

Here, $f_{M'}(x_1, x_2, \ldots, x_{M'})$ is a recursive function that takes as input a sequence (variable sequence) of M' variables $x_1$, $x_2$, ..., $x_{M'}$ and outputs one variable, and is a function expressed by Formula (8), where $x_{max}$ denotes the maximum of the M' variables $x_1$, $x_2$, ..., $x_{M'}$, K denotes the number of variables that take the maximum, $m_1, m_2, \ldots, m_K$ denote numbers in the variable sequence of the K variables that take the maximum, $\tilde{x}_1, \tilde{x}_2, \ldots, \tilde{x}_{M'-K}$ denotes a sequence of M'−K variables of the variable sequence $x_1, x_2, \ldots, x_{M'}$ excluding the variables taking the maximum, $f_0$ is 0, and $_{M'}C_K$ is the number of combinations when selecting K pieces from M' pieces.

$$f_{M'}(x_1, x_2, \ldots, x_{M'}) = \sum_{m=0}^{K-1} {}_{M'}C_m x_{max}^{M'-m} + \\ {}_{M'}C_K f_{M'-K}(\tilde{x}_1, \tilde{x}_2, \ldots, \tilde{x}_{M'-K}) + \sum_{i=0}^{K-1} {}_{M'-m_{i+1}}C_{K-i} \tag{8}$$

The selection information s is subtracted in Formula (7), but the selection information s may be added. In Formula (7), instead of setting any of the integer values from 0 to J−1 as the selection information s, any of J consecutive integer values $J_0$ to $J_0$+J−1 each predetermined so as to correspond to the input J-value selection information may be set as the selection information s. Formula (7) is a method for obtaining one converted integer value from the M integer values from the first integer value to the Mth integer value, and the integer value corresponding to the J-value selection information by reversible conversion that can be expressed algebraically, but conversion performed by the integer integrator 153 does not necessarily need to be conversion that can be expressed algebraically, and may be any conversion as long as it is a method for obtaining one converted integer value from the M integer values from the first integer value to the Mth integer value, and the integer value corresponding to the J-value selection information by reversible conversion, that is, conversion that can be inversely converted. However, taking into consideration encoding processing of the integer encoder 16, the conversion performed by the integer integrator 153 is desirable to be conversion that obtains a smaller converted integer value as each integer value of the first integer value to the Mth integer value is smaller, and obtains a smaller converted integer value as much as possible like Formula (7).

<<Decoder>>

A processing procedure of a decoding method performed by a decoder according to the third embodiment will be described with reference to FIGS. 5 and 6. The decoder 202 according to the third embodiment comprises, for example, an integer decoder 25 and an integer inverse converter 26 as in the encoder according to the second embodiment. The decoder 202 performs processes of step S25 and step S26 shown in FIG. 6 and thereby the decoding method according to the third embodiment is implemented.

The integer code output by the encoder 102 according to the third embodiment is input into the decoder 202 according to the third embodiment. The decoder 202 according to the third embodiment decodes the input integer code by decoding processing corresponding to the encoder 102 according to the third embodiment to obtain a sequence of integer values, performs inverse conversion corresponding to the conversion performed by the encoder 102 according to the third embodiment for each integer value in the obtained sequence of integer values to obtain M integer values of L integer values input into the encoder 102, and thereby correctly restores M of L integer values of the sequence of the integer values input into the encoder 102 according to the third embodiment.

Because an operation of the integer decoder 25 of the decoder 202 according to the third embodiment and a process of step S25 performed by the integer decoder 25 are the same as the operation of the integer decoder 23 of the decoder 201 according to the second embodiment and the process of step S23 performed by the integer decoder 23, only the integer inverse converter 26 that operates differently from that according to the second embodiment will be described here.

[Integer Inverse Converter 26]

The converted integer sequence $y\_1, y\_2, \ldots, y\_N$ output by the integer decoder 25 is input into the integer inverse converter 26. The integer inverse converter 26 obtains and outputs an integer sequence $x\_1, x\_2, \ldots, x\_{LN}$ from the input converted integer sequence $y\_1, y\_2, \ldots, y\_N$ (step S26). The integer inverse converter 26 includes, for example, an integer separator 261, an integer set restorer 262, and an integer sequence restorer 263 as shown in FIG. 7, and performs processes of step S261, step S262, and step S263 shown in FIG. 8.

[[Integer Separator 261]]

The integer separator 261 performs inverse conversion corresponding to the conversion performed by the integer integrator 153 of the encoder 102 according to the third embodiment for each converted integer value $y\_1, y\_2, \ldots, y\_N$ included in the converted integer sequence, obtains M integer values from a first integer value $x_1$ to an Mth integer value $x_M$ and selection information s, and outputs them to the integer set restorer 262 (step S261).

For example, when the integer integrator 153 of the encoder 102 according to the third embodiment performs conversion of Formula (7), the integer separator 261 obtains the M integer values from the first integer value $x_1$ to the Mth integer value $x_M$, and a J-value integer value s corresponding to the selection information from one integer value y by Formulas (9), (10), and (11) as inverse conversion of the conversion of Formula (7).

$$y' = \left\lfloor \frac{y + (J - 1)}{J} \right\rfloor \quad (9)$$

$$s = Jy' - y \quad (10)$$

$$(x_1, x_2, \ldots, x_M) = f_M^{-1}(y') \quad (11)$$

Here, $f_{M'}^{-1}(y')$ is a recursive function that takes one variable as input and outputs M' variables, and by using the largest M'-th square root not exceeding y:

$$\left\lfloor \sqrt[M']{y'} \right\rfloor$$

and
the largest K by which $$y' - \sum_{m=0}^{K-1} {}_{M'}C_m \left\lfloor \sqrt[M']{y'} \right\rfloor^{M'-m}$$

does not fall below 0, and
a variable sequence $\tilde{x}_1, \tilde{x}_2, \ldots, \tilde{x}_{M'-K}$ made up of M'-K variables obtained by $$f_{M'-K}^{-1}\left(\left\lfloor \left(y' - \sum_{m=0}^{K-1} {}_{M'}C_m \left\lfloor \sqrt[M']{y'} \right\rfloor^{M'-m}\right) \Big/ {}_{M'}C_K \right\rfloor\right)$$

and
$\lambda_{M'}$ which is a remainder of dividing $$y' - \sum_{m=0}^{K-1} {}_{M'}C_m \left\lfloor \sqrt[M']{y'} \right\rfloor^{M'-m}$$

by ${}_{M'}C_K$, Formula (12) is calculated using $i_1=0$ and $i_2=0$ as initial values for each of $m=0$ to $m=M'-1$, and thereby M' integer values $x_1, x_2, \ldots, x_M$ are obtained and output.

$$\text{if } \lambda_{M'} \geq {}_{M'-m-1}C_{K-i_1} \quad (12)$$

$$x_{m+1} = \left\lfloor \sqrt[M']{y'} \right\rfloor$$

$$\lambda_{M'} = \lambda_{M'} - {}_{M'-m-1}C_{K-i_1}$$

$$i_1 = i_1 + 1$$

otherwise $$x_{m+1} = \tilde{x}_{i_2+1}$$

$$i_2 = i_2 + 1$$

In addition, $f_0^{-1}(y')$ means a function that outputs nothing. The conversion by Formulas (9), (10), and (11) is inverse conversion of the conversion of Formula (7) and a method for obtaining the M integer values from the first integer value to the Mth integer value, and the J-value integer value (any of 0 to J−1) corresponding to the selection information from one converted integer value by reversible conversion that can be expressed algebraically, but the conversion performed by the integer separator 261 does not necessarily need to be conversion that can be expressed algebraically and may be any conversion as long as it is reversible conversion, and inverse conversion of the conversion performed by the integer integrator 153 of the encoder 102, and a method for obtaining the M integer values from the first integer value to the Mth integer value, and the J-value integer value corresponding to the selection information. Note that when the integer integrator 153 of the encoder 102 performs addition instead of subtraction of the selection information s in Formula (7), the integer separator 261 should perform the following Formulas (9') and (10') instead of Formulas (9) and (10).

$$y' = \left\lfloor \frac{y}{J} \right\rfloor \quad (9')$$

$$s = y - Jy' \quad (10')$$

Note that when the integer integrator 153 of the encoder 102 sets any of J consecutive integer values $J_0$ to $J_0+J−1$ each predetermined so as to correspond to the input J-value selection information as the selection information s instead of setting any of integer values from 0 to J−1 as the selection information s in Formula (7), the integer separator 261 should perform the following Formula (9'') instead of Formula (9).

$$y' = \left\lfloor \frac{y + (J_0 + J - 1)}{J} \right\rfloor \quad (9'')$$

That is, the integer separator 261 should obtain the M integer values from the first integer value to the Mth integer value, and an integer value corresponding to the selection information from the one integer value y considering that the one integer value y obtained by the integer integrator 153 of the encoder 102 is a value obtained by subtracting or adding the integer value corresponding to the selection information among the predetermined J consecutive integer values from/to a value which is J times one integer value obtained by reversible conversion of the M integer values from the first integer value to the Mth integer value.

[[Integer Set Restorer 262]]

For each converted integer value y_1, y_2, . . . , y_N included in the converted integer sequence input into the integer inverse converter 26, the integer set restorer 262 obtains an integer set of L integer values from the M integer values from the first integer value to the Mth integer value and the selection information s (J-value integer value s corresponding to the selection information) input from the integer separator 261 by processing corresponding to the processing performed by the integer selector 152 of the encoder 102, and outputs it to the integer sequence restorer 263 (step S262).

First Example of Operation of Integer Set Restorer 262

When the integer selector 152 of the encoder 102 performs the operation of the first example, the integer set restorer 262 sets L=S+1, M=2, and J=S, and the integer set restorer 262 performs the same operation as the integer set restorer 242 according to the second embodiment. In this case, the selection information is actually a value specifying a sample number of one integer value from L−1=S integer values excluding an integer value having the smallest sample number among L integer values. However, it is possible to interpret that the predetermined rule is also included in the selection information as described in the first example of the integer selector 152 of the encoder 102. Therefore, the selection information can be said to be J=S-value selection information that specifies which of L=S+1 integer values the M=2 integer values are.

When the integer selector 152 performs operation of obtaining the selection information which is any of the predetermined J consecutive integer values instead of the same operation as that of the integer selector 132 according to the second embodiment, the integer set restorer 262 should perform operation corresponding to the operation of the integer selector 152.

Second Example of Operation of Integer Set Restorer 262

When the integer selector 152 of the encoder 102 performs the operation of the second example, the integer set restorer 262 sets $L=S_1+S_2+2$ ($S_1$ and $S_2$ are positive integers of two or more), M=4, and J=4, and the integer set restorer 262 should obtain binary first selection information and binary second selection information from J=four-value (two values×two values) selection information, perform the same operation as the integer set restorer 242 according to the second embodiment to obtain $S_1+1$ integer values from two integer values among input four integer values and the binary first selection information, perform the same operation as the integer set restorer 242 according to the second embodiment to obtain $S_2+1$ integer values from the remaining two integer values among the input four integer values and the binary second selection information, and obtain an integer set of $L=S_1+S_2+2$ integer values from the obtained $S_1+1$ integer values and $S_2+1$ integer values.

Third Example of Operation of Integer Set Restorer 262

When the integer selector 152 of the encoder 102 performs the operation of the third example, the integer set restorer 262 should obtain an integer set of L integer values from the input M integer values and $J={}_LC_M$ value selection information specifying which of the L integer values the M integer values are. For example, the integer set restorer 262 should obtain an integer set of L integer values by setting the input M integer values as M integer values specified by the selection information among the L integer values of the integer set, and setting a value, for example, 0 determined by the predetermined rule as the remaining L−M integer values of the L integer values of the integer set.

Other Example and the Like of Operation of Integer Set Restorer 262

Since there are many combinations, description is omitted, but the integer set restorer 262 may perform an operation in which the above-described first example and third example are combined and an operation in which the above-described second example and third example are combined. In short, the integer set restorer 262 may perform any operation as long as the integer set restorer 262 obtains an integer set of L integer values from the input M integer values from the first integer value to the Mth integer value and the selection information s (J-value integer value s corresponding to the selection information) by processing corresponding to the processing performed by the integer selector 152 of the encoder 102 and outputs them to the integer sequence restorer 263.

[[Integer Sequence Restorer 263]]

The integer sequence restorer 263 obtains and outputs an integer sequence $x\_1, x\_2, \ldots, x\_LN$ from N integer sets each made up of L integer values input from the integer set restorer 262 for the converted integer values $y\_1, y\_2, \ldots, y\_N$ included in the converted integer sequence input into the integer inverse converter 26 according to a rule corresponding to the rule performed by the integer set generator 151 of the encoder 102 according to the third embodiment (step S263).

When the rule performed by the integer set generator 151 of the encoder 102 according to the third embodiment is a rule that sets L consecutive integer values to an integer set, the integer set restorer 262 obtains an integer set of the integer value $x\_1$ to the integer value $x\_L$ from the converted integer $y\_1$ of the input converted integer sequence $y\_1, y\_2, \ldots, y\_N$, obtains an integer set of the integer value $x\_(L+1)$ to the integer value $x\_2L$ from the converted integer $y\_2, \ldots$, and obtains an integer set of the integer value $x\_(L(N-1)+1)$ to the integer value $x\_LN$ from the converted integer $y\_N$, and the integer sequence restorer 263 obtains and outputs an integer sequence $x\_1, x\_2, \ldots, x\_LN$ which is a sequence of the integer sets obtained by the integer set restorer 262.

The embodiments of the present invention have been described above, but specific configurations are not limited to the embodiments, and it goes without saying that even if there is a change or the like in design as appropriate without departing from the scope of the present invention, it is included in the invention. The various processes described in the embodiments may be performed not only in chronological order according to the described order, but also in parallel or individually according to processing capability of devices that perform the processes or as needed.

[Program and Recording Medium]

When various processing functions in each device described in the embodiments are implemented by a computer, processing contents of functions which each device should have are described by a program. Then, the computer executes the program, and thereby the various processing functions in each device can be implemented on the computer.

The program describing the processing contents can be recorded in a computer-readable recording medium. The computer-readable recording medium may be any recording medium, for example, a magnetic recording device, an optical disk, a magneto-optical recording medium, and a semiconductor memory.

Distribution of this program is carried out, for example, by selling, transferring, or lending a portable recording medium such as a DVD or a CD-ROM on which the program is recorded. Furthermore, the program may be stored in a storage device of a server computer, transferred from the server computer to another computer via a network, and thereby distributed.

A computer that executes such a program, for example, first stores the program recorded on the portable recording medium or the program transferred from the server computer temporarily in its own storage device. Then, when performing processing, the computer reads the program stored in its own storage device and performs the processing according to the read program. As another execution form of the program, the computer may directly read the program from the portable recording medium, and perform the processing according to the program, or further may sequentially execute processing according to a received program every time the program is transferred from the server computer to the computer. In addition, the program may be not transferred from the server computer to the computer, and the above-described processing may be performed by a so-called ASP (Application Service Provider) type service that implements a processing function only by execution instructions and result acquisition. Note that the program in the embodiment includes information which is used for processing by the computer and is similar to the program (data or the like that is not a direct command to the computer but has properties that define processing of the computer).

In the embodiments, the devices are configured by executing the predetermined program on the computer, but at least part of the processing contents may be implemented by hardware.

What is claimed is:

1. An encoder for encoding a sequence of input non-negative integer values,
the encoder comprising:
an integer selector that, for each set of S+1 (S is an integer of two or more) integer values (hereinafter referred to as "input integer values") in the input sequence, selects 2 integer values of a first integer value and a second integer value (hereinafter referred to as "selected integer values") from the S+1 input integer values, and obtains selection information that specifies which the selected integer values are;
an integer integrator that obtains one integer value (hereinafter referred to as "converted integer value") by reversibly converting each set of the 2 selected integer values and an integer value indicating the selection information and obtains a converted integer sequence which is a sequence of the obtained converted integer values; and
an integer encoder that encodes each converted integer value of the converted integer sequence to obtain a code group,
wherein the integer selector
selects an integer value having the smallest sample number from the S+1 input integer values as the first integer value,
selects an integer value having the largest value from S input integer values having larger sample numbers among the S+1 input integer values as the second integer value,
and obtains the selection information that specifies which of S input integer values having larger sample numbers among the S+1 input integer value the second integer value is.

2. An encoder comprising:
an integer selector that, for a set of L (L is an integer of three or more) input integer values (hereinafter referred to as "input integer values"), selects M (M is an integer of two or more and less than L) integer values (hereinafter referred to as "selected integer values") from the L input integer values, and obtains selection information that is one of J values (J is an integer of two or more) and that specifies which of the L input integer values the selected M selected integer values are;

an integer integrator that obtains one integer value (hereinafter referred to as "converted integer value") by reversibly converting the M selected integer values and an integer value indicating the selection information; and an integer encoder that encodes the converted integer value to obtain a code, wherein the integer integrator obtains as the converted integer value a value obtained by subtracting or adding an integer value corresponding to the selection information among predetermined J consecutive integer values from or to a value of J times one integer value obtained by reversibly converting the M selected integer values.

3. A decoder comprising:

an integer decoder that decodes a code to obtain one integer value (hereinafter referred to as "converted integer value");

an integer separator that obtains 2 integer values of a first integer value and a second integer value (hereinafter referred to as "selected integer values") and selection information from the one converted integer value by reversible conversion; and an integer set restorer that sets the 2 selected integer values as 2 output integer values specified by the selection information among S+1 (S is an integer of two or more) integer values (hereinafter referred to as "output integer values"), sets 0 as S−1 remaining output integer values, and obtains a set of the S+1 output integer values, wherein the integer set restorer sets the first integer value as one output integer value having the smallest sample number in the S+1 output integer values, sets the second integer value as one output integer value that is one of S output integer values having larger sample numbers among the S+1 output integer values, specified by the selection information, and obtains the 2 output integer values.

4. A decoder comprising:

an integer decoder that decodes a code to obtain one integer value (hereinafter referred to as "converted integer value");

an integer separator that obtains M (M is an integer of two or more) integer values (hereinafter referred to as "selected integer values") and selection information that is one of J values (J is an integer of two or more) from the one converted integer value by reversible conversion; and an integer set restorer that sets the M selected integer values as M output integer values specified by the selection information among L (L is an integer larger than M) integer values (hereinafter referred to as "output integer values"), sets 0 as L−M remaining output integer values, and obtains a set of the L output integer values, wherein the integer separator obtains the M selected integer values and an integer value corresponding to the selection information, assuming that the converted integer value is a value obtained by subtracting or adding the integer value corresponding to the selection information among predetermined J consecutive integer values from or to a value of J times one integer value obtained by reversibly converting the M selected integer values.

5. An encoding method for encoding a sequence of input non-negative integer values comprising:

an integer selection step in which for each set of S+1 (S is an integer of two or more) integer values (hereinafter referred to as "input integer values") in the input sequence, an integer selector selects 2 integer values of a first integer value and a second integer value (hereinafter referred to as "selected integer values") from the S+1 input integer values, and obtains selection information that specifies which the selected integer values are;

an integer integration step in which an integer integrator obtains one integer value (hereinafter referred to as "converted integer value") by reversibly converting each set of the 2 selected integer values and an integer value indicating the selection information and obtains a converted integer sequence which is a sequence of the obtained converted integer values; and an integer encoding step in which an integer encoder encodes each converted integer value of the converted integer sequence to obtain a code group wherein the integer selector selects an integer value having the smallest sample number from the S+1 input integer values as the first integer value, selects an integer value having the largest value from S input integer values having larger sample numbers among the S+1 input integer values as the second integer value, and obtains the selection information that specifies which of S input integer values having larger sample numbers among the S+1 input integer value the second integer value is.

6. An encoding method comprising:

an integer selection step in which for a set of L (L is an integer of three or more) input integer values (hereinafter referred to as "input integer values"), an integer selector selects M (M is an integer of two or more and less than L) integer values (hereinafter referred to as "selected integer values") from the L input integer values, and obtains selection information that is one of J values (J is an integer of two or more) and that specifies which of the L input integer values the selected M selected integer values are;

an integer integration step in which an integer integrator obtains one integer value (hereinafter referred to as "converted integer value") by reversibly converting the M selected integer values and an integer value indicating the selection information; and an integer encoding step in which an integer encoder encodes the converted integer value to obtain a code, wherein the integer integration step obtains as the converted integer value a value obtained by subtracting or adding an integer value corresponding to the selection information among predetermined J consecutive integer values from or to a value of J times one integer value obtained by reversibly converting the M selected integer values.

7. A decoding method comprising:

an integer decoding step in which an integer decoder decodes a code to obtain one integer value (hereinafter referred to as "converted integer value");

an integer separation step in which an integer separator obtains 2 integer values of a first integer value and a second integer value (hereinafter referred to as "selected integer values") and selection information from the one converted integer value by reversible conversion; and an integer set restoration step in which an integer set restorer sets the 2 selected integer values as 2 output integer values specified by the selection information among S+1 (S is an integer of two or more) integer values (hereinafter referred to as "output integer values"), sets 0 as S−1 remaining output integer values, and obtains a set of the S+1 output integer values, wherein the integer set restorer sets the first integer value as one output integer value having the smallest sample number in the S+1 output integer values, sets the second integer value as one output integer value that is one of S output integer values having larger sample numbers among the S+1 output integer values, specified by the selection information, and obtains the 2 output integer values.

8. A decoding method comprising:

an integer decoding step in which an integer decoder decodes a code to obtain one integer value (hereinafter referred to as "converted integer value");

an integer separation step in which an integer separator obtains M (M is an integer of two or more) integer values (hereinafter referred to as "selected integer values") and selection information that is one of J values (J is an integer of two or more) from the one converted integer value by reversible conversion; and an integer set restoration step in which an integer set restorer sets the M selected integer values as M output integer values specified by the selection information among L (L is an integer larger than M) integer values (hereinafter referred to as "output integer values"), sets 0 as L−M remaining output integer values, and obtains a set of the L output integer values, wherein the integer separation step obtains the M selected integer values and an integer value corresponding to the selection information, assuming that the converted integer value is a value obtained by subtracting or adding the integer value corresponding to the selection information among predetermined J consecutive integer values from or to a value of J times one integer value obtained by reversibly converting the M selected integer values.

9. A non-transitory computer-readable recording medium in which a program for causing a computer to execute each step of the encoding method according to claim 5 or 6 is recorded.

10. A non-transitory computer-readable recording medium in which a program for causing a computer to execute each step of the decoding method according to claim 7 or 8 is recorded.

* * * * *